(12) United States Patent
Chen et al.

(10) Patent No.: US 7,910,941 B2
(45) Date of Patent: Mar. 22, 2011

(54) LIGHT-EMITTING DIODE APPARATUS AND MANUFACTURING METHOD THEREOF

(75) Inventors: Shih-Peng Chen, Taoyuan Hsien (TW); Ching-Chuan Shiue, Taoyuan Hsien (TW); Chao-Min Chen, Taoyuan Hsien (TW); Horng-Jou Wang, Taoyuan Hsien (TW); Huang-Kun Chen, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 260 days.

(21) Appl. No.: 12/057,887

(22) Filed: Mar. 28, 2008

(65) Prior Publication Data

US 2008/0283859 A1    Nov. 20, 2008

(30) Foreign Application Priority Data

May 18, 2007    (TW) .............................. 96117765 A

(51) Int. Cl.
*H01L 33/60* (2010.01)
(52) U.S. Cl. ............ 257/98; 257/233; 257/599; 438/29; 438/42
(58) Field of Classification Search .................... 257/98, 257/233, 288, 599; 438/29, 42
See application file for complete search history.

(56) References Cited

U.S. PATENT DOCUMENTS

| | | | | |
|---|---|---|---|---|
| 6,841,808 | B2* | 1/2005 | Shibata et al. ................ | 257/190 |
| 2002/0014629 | A1* | 2/2002 | Shibata et al. .................. | 257/79 |
| 2002/0195609 | A1* | 12/2002 | Yoshitake et al. .............. | 257/81 |
| 2006/0225644 | A1* | 10/2006 | Lee et al. ........................ | 117/89 |
| 2007/0241321 | A1* | 10/2007 | Kuo et al. ........................ | 257/13 |
| 2007/0272930 | A1* | 11/2007 | Tseng et al. .................... | 257/79 |
| 2009/0050930 | A1* | 2/2009 | Yao et al. ...................... | 257/103 |
| 2009/0075412 | A1* | 3/2009 | Lee et al. ........................ | 438/29 |
| 2009/0206362 | A1* | 8/2009 | Sung et al. .................... | 257/103 |
| 2009/0309123 | A1* | 12/2009 | Hsu et al. ........................ | 257/99 |
| 2010/0006884 | A1* | 1/2010 | Ou et al. ......................... | 257/98 |
| 2010/0027124 | A1* | 2/2010 | Nagahama et al. ........... | 359/599 |
| 2010/0084679 | A1* | 4/2010 | Hsieh et al. .................... | 257/98 |

* cited by examiner

*Primary Examiner* — Fernando L Toledo
(74) *Attorney, Agent, or Firm* — Muncy, Geissler, Olds & Lowe, PLLC

(57) ABSTRACT

A light-emitting diode (LED) apparatus includes an epitaxial multilayer, a micro/nano rugged layer and an anti-reflection layer. The epitaxial multilayer has a first semiconductor layer, an active layer and a second semiconductor layer in sequence. The micro/nano rugged layer is disposed on the first semiconductor layer of the epitaxial multilayer. The anti-reflection layer is disposed on the micro/nano rugged layer. In addition, a manufacturing method of the LED apparatus is also disclosed.

27 Claims, 11 Drawing Sheets

LIGHT-EMITTING DIODE APPARATUS AND MANUFACTURING METHOD THEREOF

CROSS REFERENCE TO RELATED APPLICATIONS

This Non-provisional application claims priority under 35 U.S.C. §119(a) on Patent Application No(s). 096117765 filed in Taiwan, Republic of China on May 18, 2007, the entire contents of which are hereby incorporated by reference.

BACKGROUND OF THE INVENTION

1. Field of Invention

The invention relates to a light-emitting diode (LED) apparatus having a current spreading layer with a micro/nano rugged layer, and a manufacturing method thereof.

2. Related Art

A light-emitting diode (LED) apparatus is a lighting apparatus made of semiconductor materials. The LED apparatus pertains to a cold lighting apparatus, has the advantages of low power consumption, long lifetime, light response speed and small size, and can be manufactured into an extremely small or array-type apparatus. With the continuous progress of the recent technology, the application range thereof covers an indicator of a computer or a house appliance product, a backlight source of a liquid crystal display (LCD) apparatus, a traffic sign or a vehicle indicator.

However, the current LED apparatus still has the problems of the poor light-emitting efficiency and the low luminance. What causes the poor light-emitting efficiency is that the light emitted from the LED is the omni-direction light and is not simply focused on a certain location. In addition, only a portion of the light generated by the LED can be outputted, and the other portion of the light is absorbed due to reflection. Consequently, the luminance of the LED apparatus is decreased, and the heat generated by the LED apparatus is also increased.

In general, the LED apparatus may be a flip-chip type LED apparatus, a vertical type LED apparatus or a front-side type LED apparatus. In order to solve the problem of the low light emitting efficiency caused by the reflection, the following technology has been proposed. As shown in FIG. 1, a LED apparatus 1, a vertical type LED apparatus, has an n-type semiconductor layer 121, an active layer 122 and a p-type semiconductor layer 123 in sequence formed on a surface of a substrate 11. Next, a current spreading layer 13 is formed on the p-type semiconductor doping layer 123, and a first electrode 14 and a second electrode 15 are respectively formed on the current spreading layer 13 and the other surface of the substrate 11.

In the above-mentioned structure, the light outputted from the active layer 122 cannot be emitted out of the LED apparatus 1 until passing through the p-type semiconductor layer 123 and the current spreading layer 13. In addition, the p-type semiconductor layer 123, the current spreading layer 13 and the refractive index of the air are not properly matched, the total reflection may occur when the light is being emitted out, thereby decreasing the light outputting efficiency.

Therefore, there is a need to provide a light-emitting diode (LED) apparatus capable of decreasing total reflection of light so as to increase the light outputting efficiency, and a manufacturing method thereof.

SUMMARY OF THE INVENTION

In view of the foregoing, an object of the present invention is to provide a light-emitting diode (LED) apparatus capable of decreasing total reflection of light and having uniformly distributed currents, and a manufacturing method thereof.

To achieve the above, the present invention discloses a light-emitting diode (LED) apparatus including an epitaxial multilayer, a micro/nano rugged layer and an anti-reflection layer. The epitaxial multilayer in sequence has a first semiconductor layer, an active layer and a second semiconductor layer. The micro/nano rugged layer is disposed on the first semiconductor layer of the epitaxial multilayer. The anti-reflection layer is disposed on the micro/nano rugged layer.

To achieve the above, the invention also discloses a manufacturing method of a light-emitting diode (LED) apparatus. The method includes the steps of: forming a first semiconductor layer on an epitaxial substrate; forming an active layer on the first semiconductor layer; forming a second semiconductor layer on the active layer, wherein the first semiconductor layer, the active layer and the second semiconductor layer constitute an epitaxial multilayer; and forming a micro/nano rugged layer on the first semiconductor layer of the epitaxial multilayer.

In the LED apparatus and manufacturing thereof of the invention, the refractive index of the micro/nano rugged layer ranges between the refractive index of the epitaxial multilayer and the refractive index of air. The refractive index of the anti-reflection layer ranges between the refractive index of the micro/nano rugged layer and the refractive index of air. The anti-reflection layer includes a plurality of micro/nano particles, each of which has a diameter ranging between 50 nanometers and 50 microns.

As mentioned above, the LED and the manufacturing method according to the present invention utilize the micro/nano rugged layer and the anti-reflection layer to decrease the total reflection loss, to achieve the refractive index matching thereof, and thus to increase the light emitting efficiency of the LED apparatus.

BRIEF DESCRIPTION OF THE DRAWINGS

The present invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

First Embodiment

Figure 1:
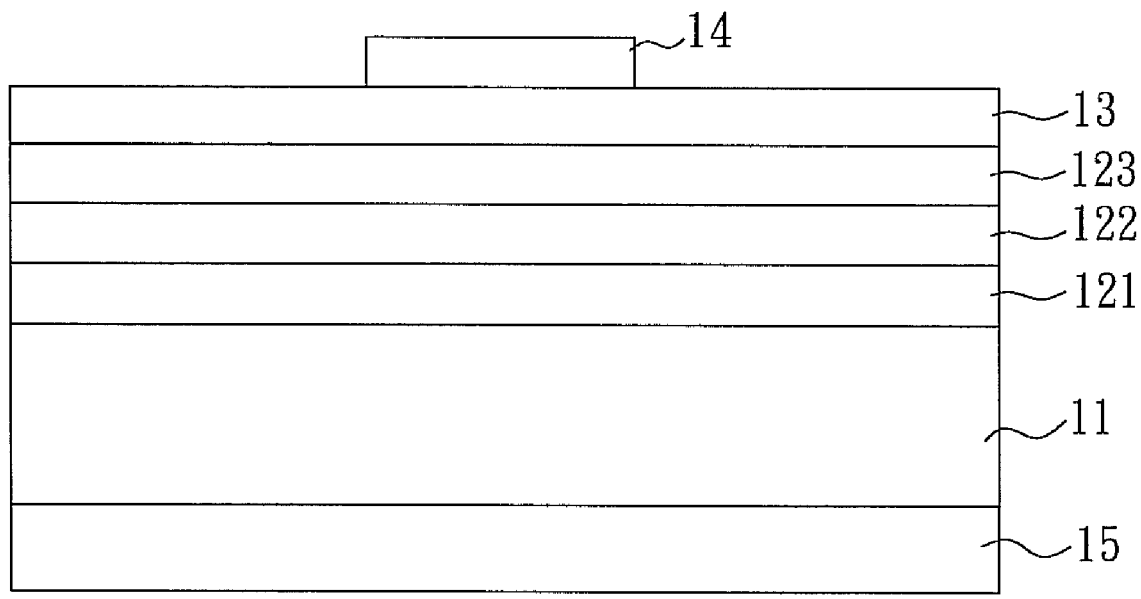
FIG. 1 is a schematic illustration showing a conventional LED apparatus.
Figure 2:
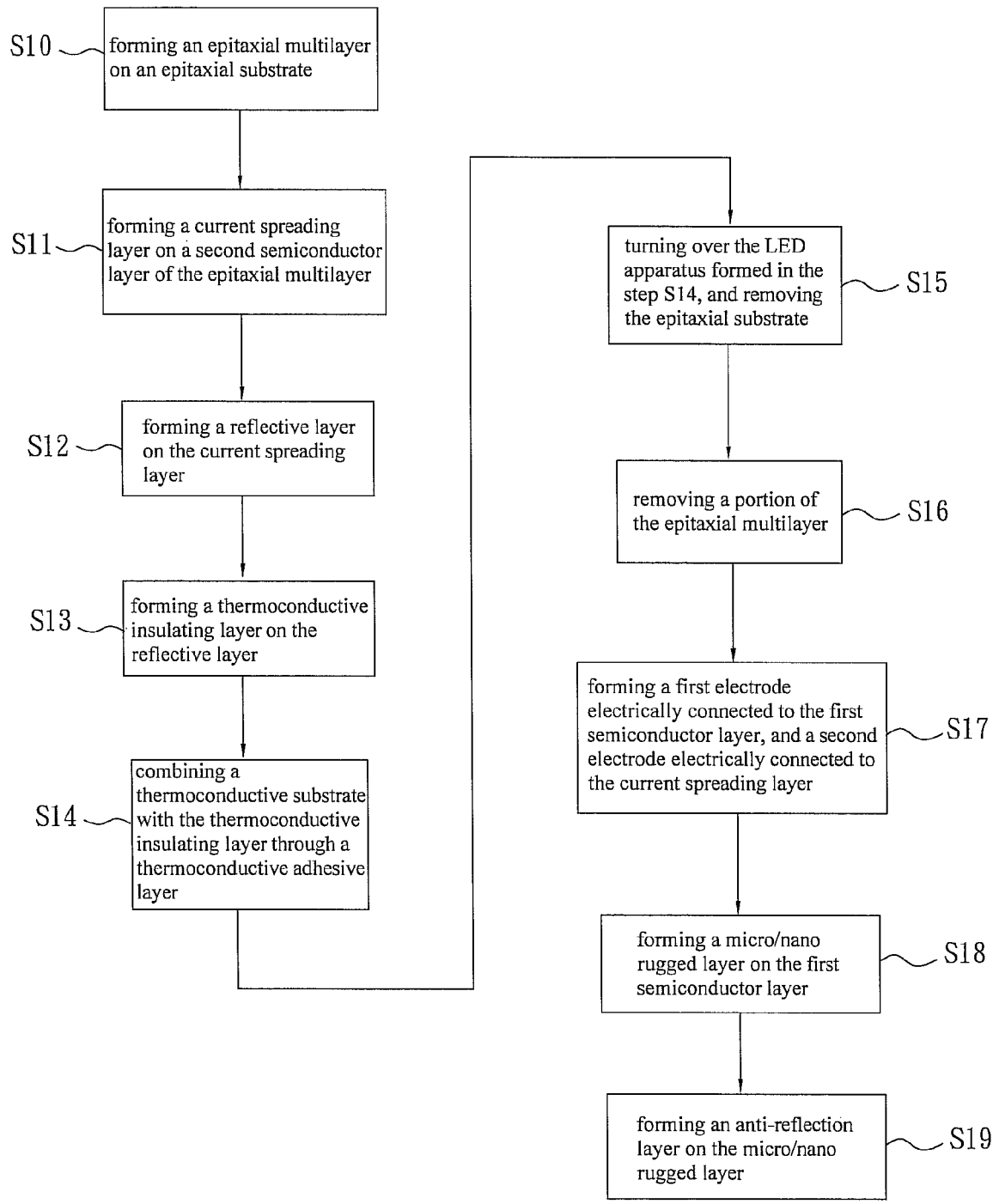
FIG. 2 is a flow chart showing a manufacturing method of a LED apparatus according to a first embodiment of the invention.

As shown in FIG. 2, a manufacturing method of a LED apparatus according to a first embodiment of the invention includes steps S10 to S19. Illustrations will be made by referring to FIG. 2 in conjunction with FIGS. 3A to 3K.

Figure 3A:
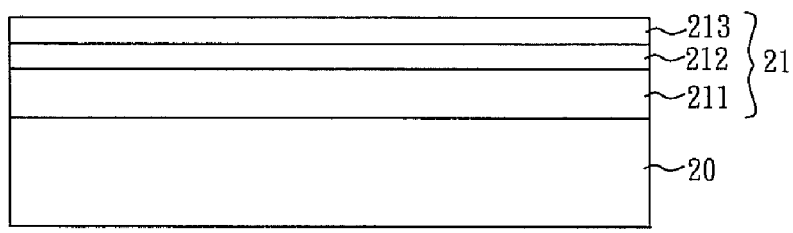
FIGS. 3A to 3K are schematic illustrations showing the LED apparatus corresponding to FIG. 2.

As shown in FIG. 3A, in step S10, a first semiconductor layer 211 is formed on an epitaxial substrate 20, an active layer 212 is formed on the first semiconductor layer 211, and a second semiconductor layer 213 is formed on the active layer 212. The first semiconductor layer 211, the active layer 212 and the second semiconductor layer 213 constitute an epitaxial multilayer 21. In this embodiment, the first semiconductor layer 211 and the second semiconductor layer 213 can be respectively a P-type epitaxial layer and an N-type epitaxial layer, or respectively the N-type epitaxial layer and the P-type epitaxial layer.

Figure 3B:
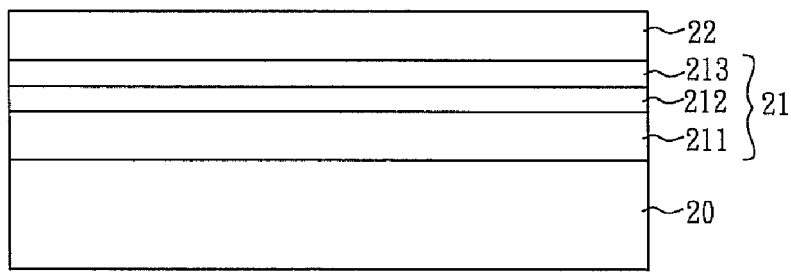

As shown in FIG. 3B, in step S11, a current spreading layer 22 is formed on the second semiconductor layer 213. In this embodiment, the material of the current spreading layer 22 can be, for example but not limited to, indium tin oxide (ITO), aluminum-doped zinc oxide (AZO), zinc oxide (ZnO), nickel/aluminum alloy or antimony tin oxide (ATO), according to the prior consideration of uniformly spreading the currents.

Figure 3C:
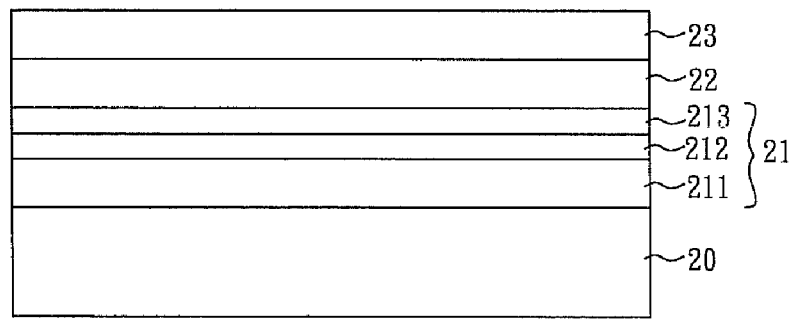

As shown in FIG. 3C, in the step S12, a reflective layer 23 is formed on the current spreading layer 22. In this embodiment, the reflective layer 23 can be a metal reflective layer, which has the effect of enhancing the reflection and can also provide the preferred thermoconductive path. The material of the metal reflective layer includes platinum (Pt), gold (Au), silver (Ag), palladium (Pd), nickel (Ni), chromium (Cr), titanium (Ti), chromium/aluminum (Cr/Al), nickel/aluminum (Ni/Al), titanium/aluminum (Ti/Al), titanium/silver (Ti/Ag), chromium/platinum/gold (Cr/Pt/Au), alloys thereof, multimetal layers thereof or combinations thereof, wherein chromium/aluminum (Cr/Al), nickel/aluminum (Ni/Al), titanium/aluminum (Ti/Al), titanium/silver (Ti/Ag), chromium/platinum/gold (Cr/Pt/Au) is an alloy or a multi-metal layer. Take A/B for example. When A/B is a two-metal layer, A is a first metal layer, and B is a second metal layer. When A/B/C is a three metal layer, A is a first metal layer and B is a second metal layer and C is a third metal layer. This concept is applied to all other embodiments of the present invention, and will not be described anymore. In addition, the reflective layer 23 can be an optical reflective device composed of dielectric films with different refractive indexes, a metal reflective layer, a metal dielectric reflective layer or an optical reflective device composed of micro/nano balls. That is, the reflective layer 23 can be formed by combing or stacking a plurality of materials together.

Figure 3D:
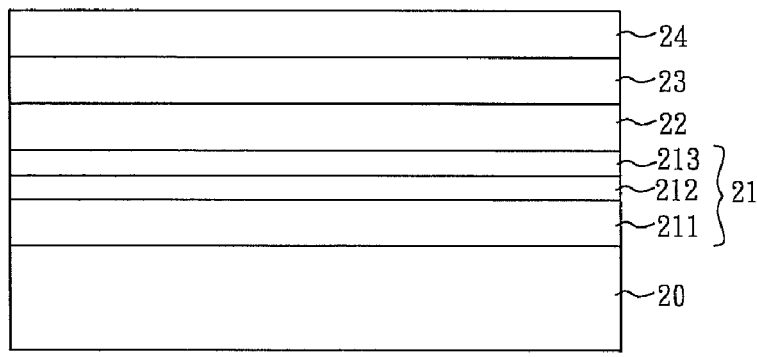

As shown in FIG. 3D, in the step S13, a thermoconductive insulating layer 24 is formed on the reflective layer 23. In this embodiment, the material of the thermoconductive insulating layer 24 is an insulating material, such as aluminum nitride or silicon carbide, having a coefficient of thermal conductivity greater than or equal to 150 W/mK. In addition, the refractive index of the thermoconductive insulating layer 24 ranges between the refractive index of the epitaxial multilayer 21 and the refractive index of the air.

Figure 3E:
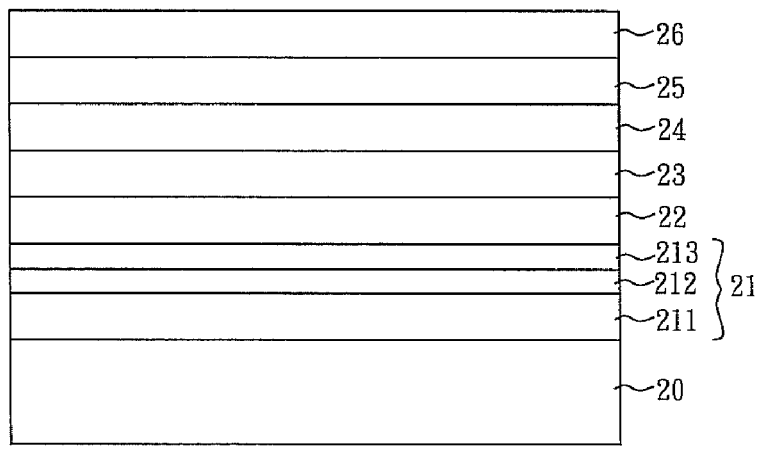

As shown in FIG. 3E, in the step S14, a thermoconductive substrate 26 is combined with the thermoconductive insulating layer 24 through a thermoconductive adhesive layer 25. In this embodiment, the material of the thermoconductive adhesive layer 25 can be pure metal, alloy metal, an electroconductive material, a non-electroconductive material or an organic material, which can be selected from the group consisting of gold, soldering paste, tin-silver paste, silver paste and combinations thereof, or can be an eutectic bonding material, such as silicon-gold (Si—Au), gold-arsenic (Au—Sn), or the like. In addition, the material of the thermoconductive substrate 26 in this embodiment can be silicon (Si), gallium arsenide (GaAs), gallium phosphide (GaP), silicon carbide (SiC), boron nitride (BN), aluminum (Al), aluminum nitride (AlN), copper (Cu) or combinations thereof.

Figure 3F:
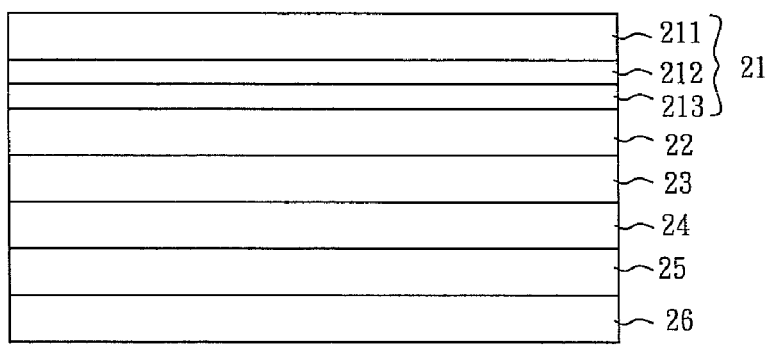

As shown in FIG. 3F, in the step S15, the LED apparatus 2 formed in the step S14 is turned over, and the epitaxial substrate 20 is removed.

Figure 3G:
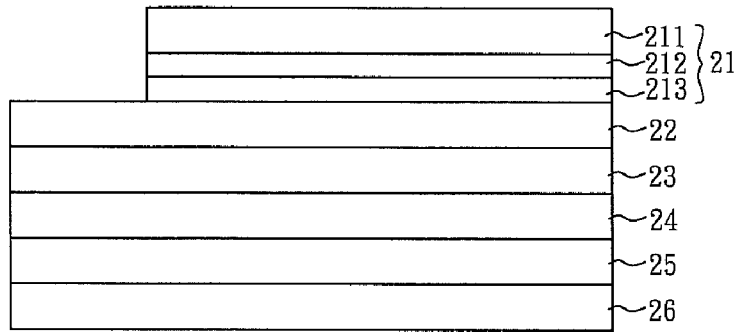

As shown in FIG. 3G, a portion of the epitaxial multilayer 21 is removed in the step S16. That is, a portion of the first semiconductor layer 211, a portion of the active layer 212 and a portion of the second semiconductor layer 213 are removed to expose a portion of the current spreading layer 22. Alternatively, a portion of the first semiconductor layer 211 and a portion of the active layer 212 are removed to expose a portion of the second semiconductor layer 213.

Figure 3H:
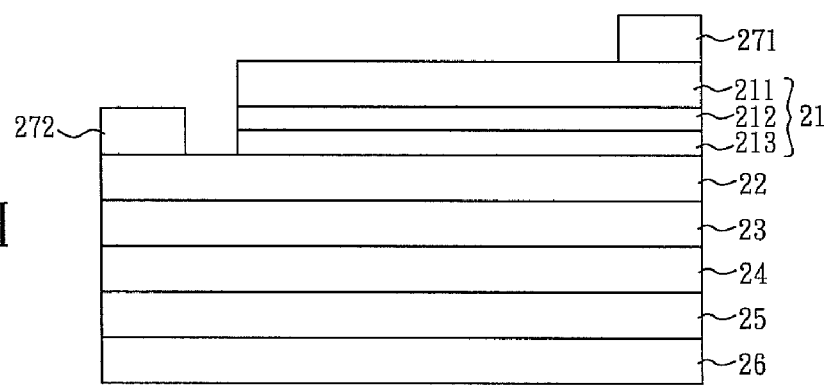

As shown in FIG. 3H, in the step S17, a first electrode 271, which is electrically connected to the portion of the first semiconductor layer 211, and a second electrode 272, which is electrically connected to the current spreading layer 22 exposed to the first semiconductor layer 211, the active layer 212 and the second semiconductor layer 213, are formed. Alternatively, the second electrode 272 can be formed on the exposed second semiconductor layer 213.

Figure 3I:
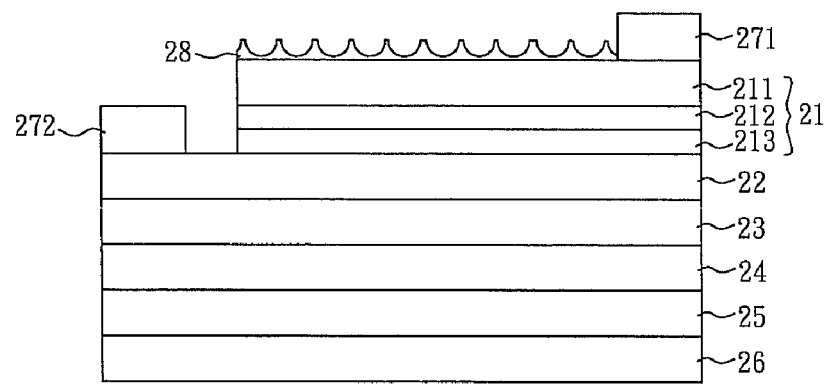
Figure 3J:
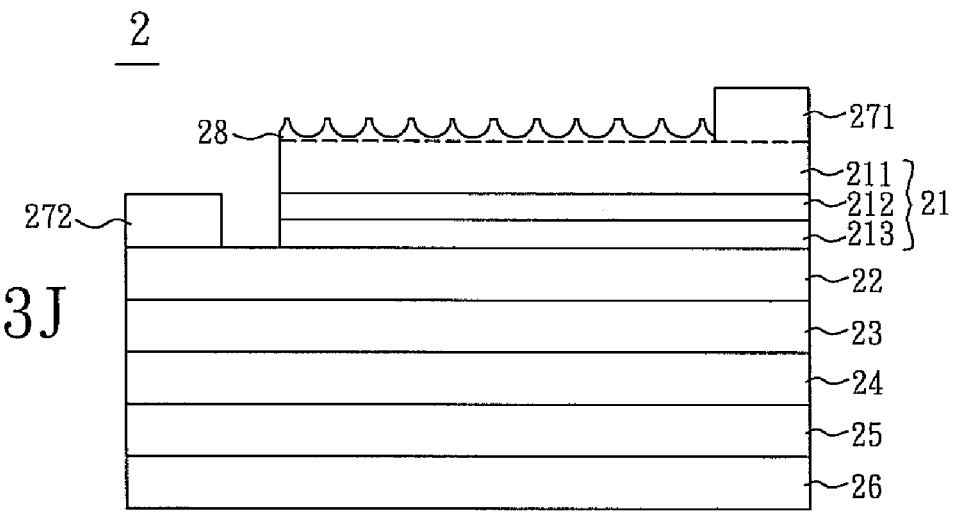

In the step S18, a micro/nano rugged layer 28 is formed on the other portion of the first semiconductor layer 211 by, for example but not limited to, stacking, sintering, anodic aluminum oxidizing (AAO), nano-imprinting, hot pressing, etching or electron beam writer (E-beam writer) processing. The micro/nano rugged layer 28 can be a nano-ball, a nano-column, a nano-hole, a nano-point, a nano-line or a nano-concave-convex structure. In this embodiment, the refractive index of the micro/nano rugged layer 28 is greater than the refractive index (about 1) of the air and is smaller than the refractive index (about 2.5) of the epitaxial multilayer 21, and the material of the micro/nano rugged layer 28 can be selected from the group consisting of $Al_2O_3$, $Si_3N_4$, $SnO_2$, $SiO_2$, resin, polycarbonate and combinations thereof. It is to be noted that the micro/nano rugged layer 28 can be additionally formed on the first semiconductor layer 211, as shown in FIG. 3I. Alternatively, the micro/nano rugged layer 28 is a surface roughing portion of the first semiconductor layer 211, as shown in FIG. 3J.

Figure 3K:
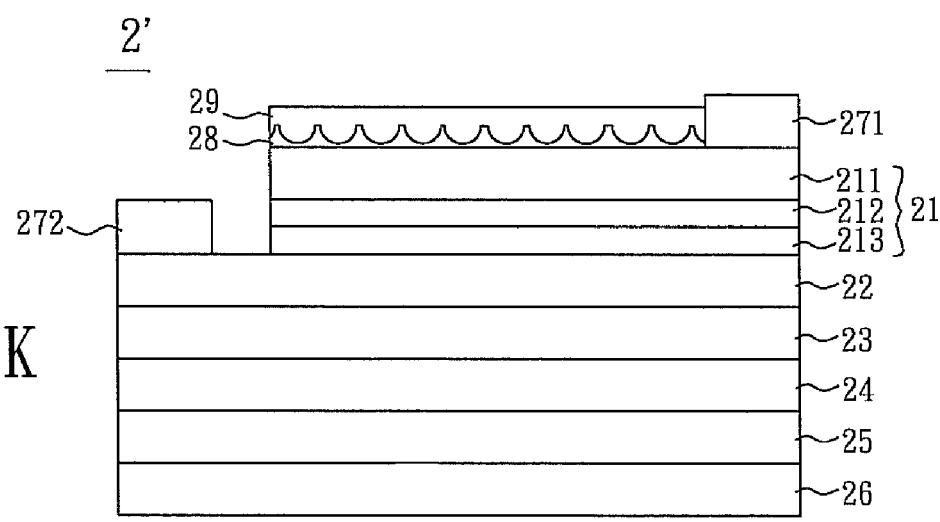

As shown in FIG. 3K, in the step S19, an anti-reflection layer 29 is further formed on the micro/nano rugged layer 28 to constitute a front-side type LED apparatus 2'. It is to be noted that the structure of FIG. 3K is formed based on the micro/nano rugged layer 28 of FIG. 3I. Of course, the step S19 may also be performed based on the micro/nano rugged layer 28 of FIG. 3J. In this embodiment, the anti-reflection layer 29 is composed of a plurality of micro/nano particles, each of which has a diameter ranging between 50 nanometers to 50 microns. In addition, the refractive index of the anti-reflection layer ranges between the refractive index of the micro/nano rugged layer and the refractive index of the air. Meanwhile, the anti-reflection layer 29 can have the structure formed by a single-layer or multi-layer dielectric film.

It is to be noted that the order of the above-mentioned steps can also be changed according to the actual requirement.

Second Embodiment

Figure 4:
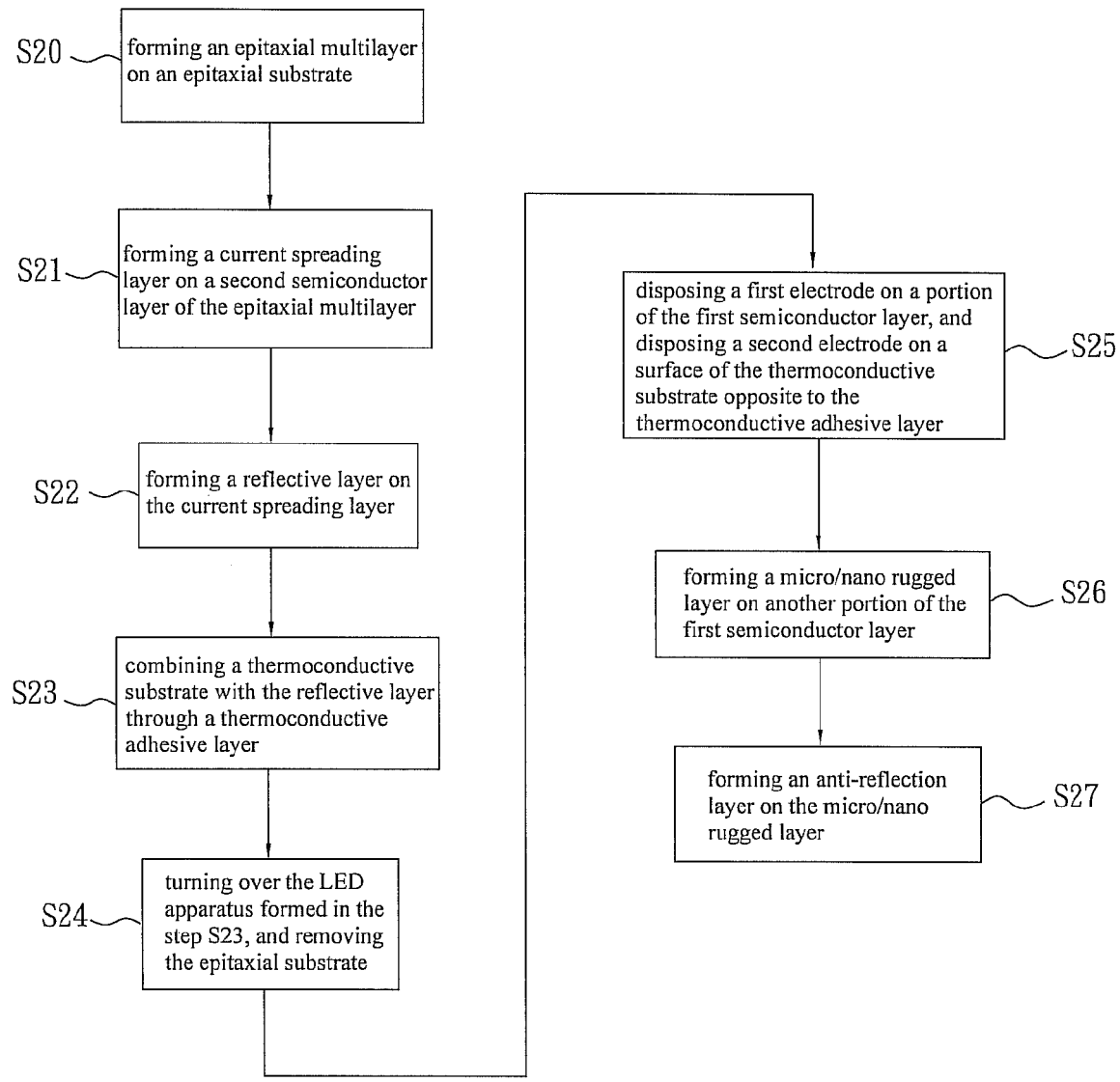
FIG. 4 is a flow chart showing a manufacturing method of a LED apparatus according to a second embodiment of the invention.

Referring to FIG. 4, a manufacturing method of a LED apparatus (a vertical type LED apparatus) according to a second embodiment of the invention includes steps S20 to S27. Illustrations will be made by referring to FIG. 4 in conjunction with FIGS. 5A to 5G.

Figure 5A:
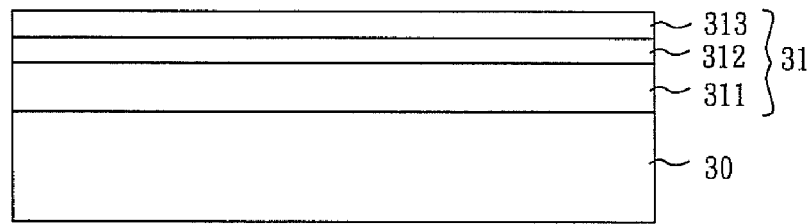
FIGS. 5A to 5G are schematic illustrations showing the LED apparatus corresponding to FIG. 4.

As shown in FIG. 5A, in the step S20, an epitaxial multilayer 31 is formed on an epitaxial substrate 30. The epitaxial multilayer 31 is composed of a first semiconductor layer 311, an active layer 312 and a second semiconductor layer 313 in sequence. In this embodiment, the first semiconductor layer 311 and the second semiconductor layer 213 can be respectively a P-type epitaxial layer and an N-type epitaxial layer, or respectively the N-type epitaxial layer and the P-type epitaxial layer.

Figure 5B:
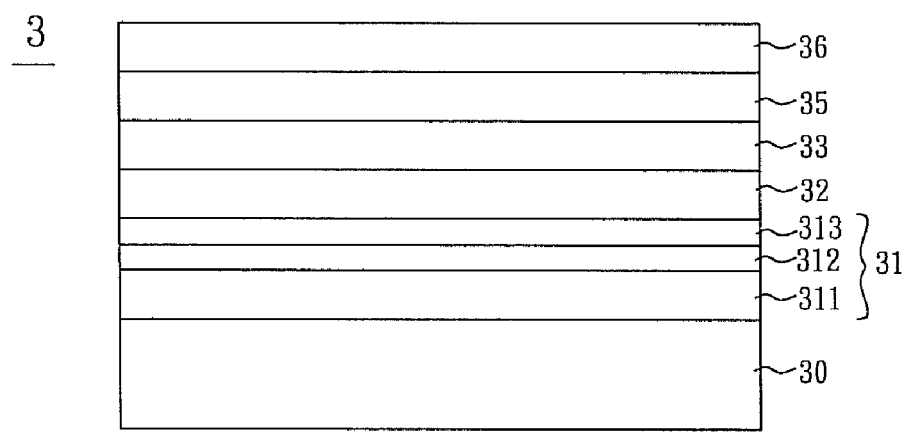

In FIG. 5B, the structure after the steps S21 to S23 are performed is illustrated. In step S21, a current spreading layer 32 is formed on the second semiconductor layer 313. In this embodiment, the material of the current spreading layer 32 can be, for example but not limited to, indium tin oxide (ITO), aluminum-doped zinc oxide (AZO), zinc oxide (ZnO), nickel/aluminum alloy or antimony tin oxide, according to the prior consideration of uniformly spreading the currents.

In the step S22, a reflective layer 33 is formed on the current spreading layer 32. In this embodiment, the reflective layer 33 can be a metal reflective layer, which has the effect of enhancing the reflection and can also provide the good thermoconductive path. The material of the metal reflective layer can be selected from the group consisting of platinum, gold, silver, palladium, nickel, chromium, titanium, chromium/aluminum, nickel/aluminum, titanium/aluminum, titanium/silver, chromium/platinum/aluminum, alloys thereof, multi-metal layers thereof and combinations thereof. The reflective layer 33 can be composed of a plurality of materials combined or stacked together.

In step S23, a thermoconductive substrate 36 is combined with the reflective layer 33 through a thermoconductive adhesive layer 35. In this embodiment, the material of the thermoconductive adhesive layer 35 can be pure metal, alloy metal, an electroconductive material, a non-electroconductive material or an organic material, which can be selected from the group consisting of gold, soldering paste, tin-silver paste, silver paste and combinations thereof, or can be an eutectic bonding material, such as silicon-gold (Si—Au), gold-arsenic (Au—Sn) or the like. In addition, the material of the thermoconductive substrate 36 in this embodiment can be selected from the group consisting of silicon, gallium arsenide, gallium phosphide, silicon carbide, boron nitride, aluminum, aluminum nitride, copper and combinations thereof.

Figure 5C:
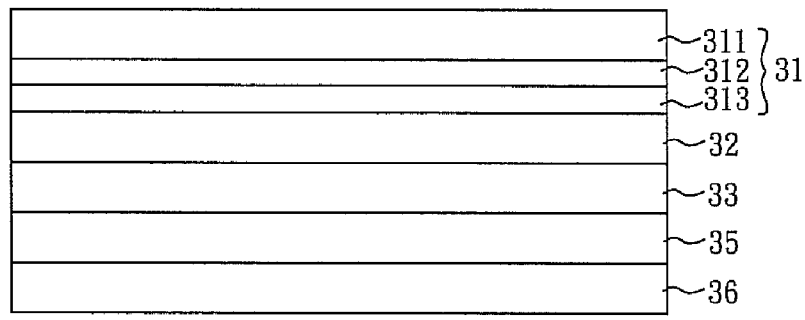

As shown in FIG. 5C, in the step S24, the LED apparatus 3 formed in the step S23 is then turned over, and the epitaxial substrate 30 is removed.

Figure 5D:
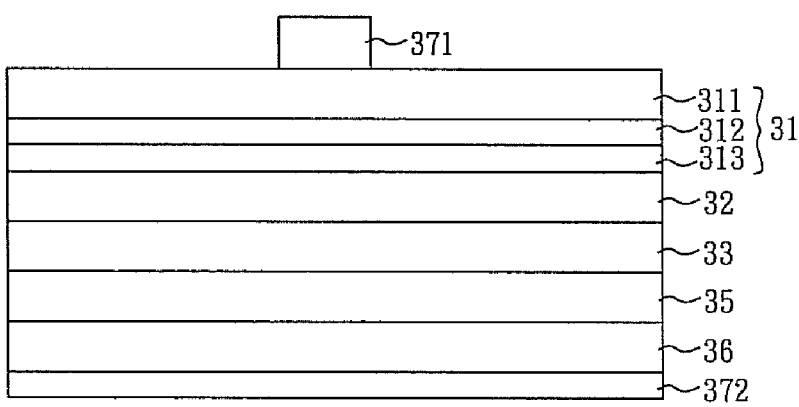

As shown in FIG. 5D, a first electrode 371 is disposed on a portion of the first semiconductor layer 311, and a second electrode 372 is disposed on a surface 361 of the thermoconductive substrate 36 opposite to the thermoconductive adhesive layer 35 in the step S25. Alternatively, the thermoconductive substrate 36 can serve as a second electrode and, therefore, there is no need to form the second electrode 372.

Figure 5E:
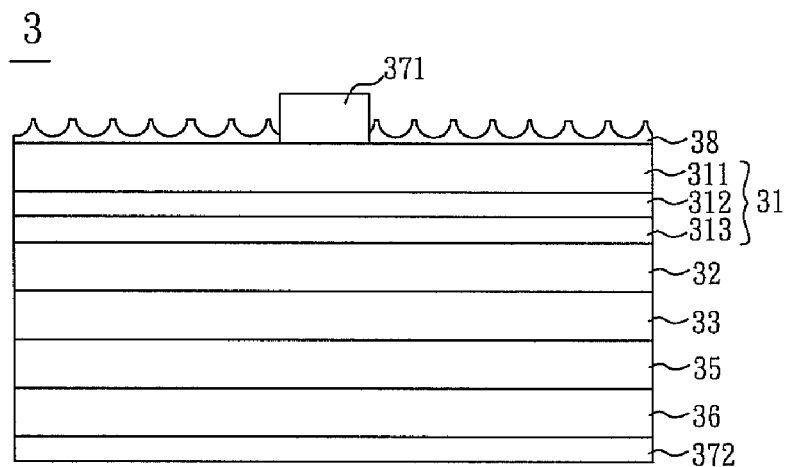
Figure 5F:
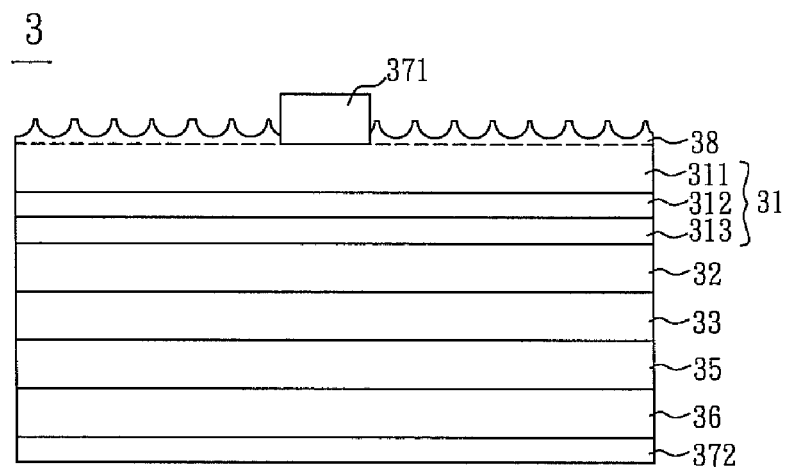

As shown in FIG. 5E, a micro/nano rugged layer 38 is formed on another portion of the first semiconductor layer 311 by, for example but not limited to, stacking, sintering, anodic aluminum oxidizing (AAO), nano-imprinting, hot pressing, etching or electron beam writer (E-beam writer) processing in the step S26. The micro/nano rugged layer 38 can be a nano-ball, a nano-column, a nano-hole, a nano-point, a nano-line or a nano-concave-convex structure. In this embodiment, the refractive index of the micro/nano rugged layer 38 is greater than the refractive index (about 1) of the air and is smaller than the refractive index (about 2.5) of the epitaxial multilayer 31, and the material of the micro/nano rugged layer 38 can be selected from the group consisting of $Al_2O_3$, $Si_3N_4$, $SnO_2$, $SiO_2$, resin, polycarbonate and combinations thereof. It is to be noted that the micro/nano rugged layer 38 can be additionally formed on the first semiconductor layer 311, as shown in FIG. 5E. Alternatively, the micro/nano rugged layer 38 is a surface roughing portion of the first semiconductor layer 311, as shown in FIG. 5F.

Figure 5G:
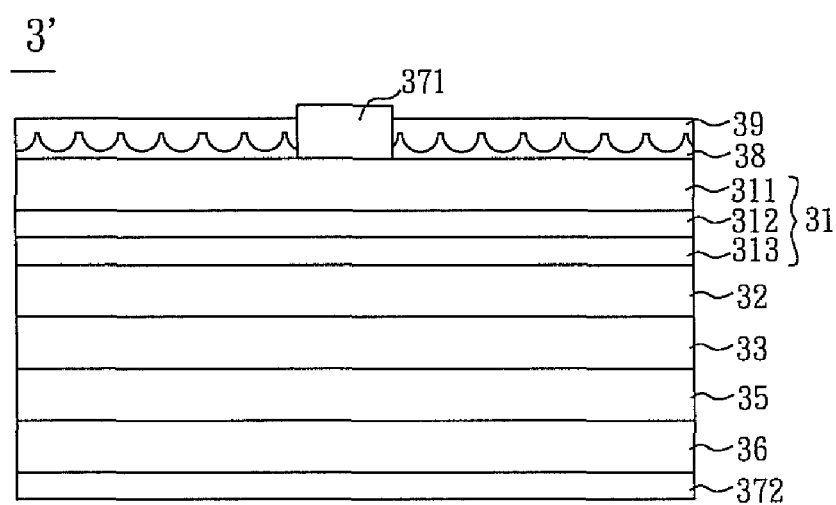

In addition, as shown in FIG. 5G, an anti-reflection layer 39 is further formed on the micro/nano rugged layer 38 in the step S27 to constitute a vertical type LED apparatus 3'. It is to be noted that the structure of FIG. 5G is formed based on the micro/nano rugged layer 38 of FIG. 5E. Of course, the step S27 can also be performed based on the micro/nano rugged layer 38 of FIG. 5F. In this embodiment, the anti-reflection layer 39 is composed of a plurality of micro/nano particles each having a diameter ranging between 50 nanometers and 50 microns. In addition, the refractive index of the anti-reflection layer ranges between the refractive index of the micro/nano rugged layer and the refractive index of the air. Meanwhile, the anti-reflection layer 39 can have the structure formed by a single-layer or multi-layer dielectric film.

It is to be noted that the order of the above-mentioned steps can also be changed according to the actual requirement.

In summary, the LED and the manufacturing method according to the invention use the micro/nano rugged layer and the anti-reflection layer to decrease the total reflection loss, to achieve the refractive index matching thereof, and thus to increase the light emitting efficiency of the LED apparatus.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A light-emitting diode (LED) apparatus, comprising:
    an epitaxial multilayer comprising a first semiconductor layer, an active layer and a second semiconductor layer;
    a micro/nano rugged layer formed on the first semiconductor layer of the epitaxial multilayer; and
    an anti-reflection layer disposed on the micro/nano rugged layer, wherein a refractive index of the anti-reflection layer ranges between a refractive index of the micro/nano rugged layer and a refractive index of air.

2. The LED apparatus according to claim 1, wherein a refractive index of the micro/nano rugged layer ranges between a refractive index of the epitaxial multilayer and a refractive index of air.

3. The LED apparatus according to claim 1, wherein the anti-reflection layer has a structure formed by a single-layer dielectric film or a multi-layer dielectric film.

4. The LED apparatus according to claim 1, wherein the anti-reflection layer comprises a plurality of micro/nano particles, and each of the micro/nano particles has a diameter ranging between 50 nanometers and 50 microns.

5. The LED apparatus according to claim 1, wherein one of the first semiconductor layer and the second semiconductor layer is a P-type epitaxial layer, and the other is an N-type epitaxial layer.

6. The LED apparatus according to claim 1, wherein the micro/nano rugged layer is a surface roughing portion of the first semiconductor layer, or a layer different from the first semiconductor layer.

7. The LED apparatus according to claim 1, wherein the micro/nano rugged layer comprises a nano-ball, a nano-column, a nano-hole, a nano-point, a nano-line or a nano-concave-convex structure.

8. The LED apparatus according to claim 1, wherein, and a material of the micro/nano rugged layer comprises $Al_2O_3$, $Si_3N_4$, $SnO_2$, $SiO_2$, resin, polycarbonate, ITO, AZO, ZnO or combinations thereof.

9. The LED apparatus according to claim 1, further comprising:
a thermoconductive substrate disposed opposite to the second semiconductor layer;
a thermoconductive adhesive layer disposed between the thermoconductive substrate and the second semiconductor layer.

10. The LED apparatus according to claim 9, wherein the thermoconductive substrate is an electroconductive substrate or an insulating substrate; a material of the thermoconductive substrate comprises silicon, gallium arsenide, gallium phosphide, silicon carbide, boron nitride, aluminum, aluminum nitride, copper or combinations thereof; a material of the thermoconductive adhesive layer comprises silicon-gold (Si—Au), gold-arsenic (Au—Sn), an eutectic bonding material, gold, a solder paste, a solder-silver paste, a silver paste or combinations thereof, or a material of the thermoconductive adhesive layer comprises a metal, an alloy, an electroconductive material, a non-electroconductive material or an organic material.

11. The LED apparatus according to claim 9, further comprising:
a reflective layer disposed between the thermoconductive adhesive layer and the second semiconductor layer; and
a current spreading layer disposed between the reflective layer and the second semiconductor layer.

12. The LED apparatus according to claim 11, wherein a material of the current spreading layer comprises indium tin oxide (ITO), aluminum-doped zinc oxide (AZO), zinc oxide (ZnO), nickel/aluminum alloy (Ni/Au) or antimony tin oxide (ATO); a material of the reflective layer comprises platinum (Pt), gold (Au), silver (Ag), palladium (Pd), nickel (Ni), chromium (Cr), titanium (Ti), chromium/aluminum (Cr/Al), nickel/aluminum (Ni/Al), titanium/aluminum (Ti/Al), titanium/silver (Ti/Ag), chromium/platinum/aluminum (Cr/Pt/Al), alloys thereof, multi-metal layers thereof or combinations thereof, or the reflective layer is an optical reflective device composed of a plurality of dielectric films with different refractive indexes, a metal reflective layer, a metal dielectric reflective layer or an optical reflective device composed of micro/nano balls.

13. The LED apparatus according to claim 11, wherein a portion of the first semiconductor layer is exposed, and the LED apparatus further comprises:
a first electrode electrically connected to the exposed portion of the first semiconductor layer; and
a second electrode electrically connected to the thermoconductive substrate.

14. The LED apparatus according to claim 11, further comprising a thermoconductive insulating layer disposed between the thermoconductive adhesive layer and the reflective layer.

15. The LED apparatus according to claim 14, wherein a portion of the first semiconductor layer is exposed, or a portion of the second semiconductor layer is exposed, and the LED apparatus further comprises:
a first electrode electrically connected to the exposed portion of the first semiconductor layer; and
a second electrode electrically connected to the exposed portion of the second semiconductor layer.

16. The LED apparatus according to claim 15, wherein a material of the thermoconductive insulating layer is an insulating material having a coefficient of thermal conductivity greater than or equal to 150 W/mK.

17. The LED apparatus according to claim 15, wherein a material of the thermoconductive insulating layer is aluminum nitride or silicon carbide.

18. A manufacturing method of a light-emitting diode (LED) apparatus, comprising steps of:
forming an epitaxial multilayer on an epitaxial substrate, wherein the epitaxial multilayer comprises a first semiconductor layer, an active layer, and a second semiconductor layer; and
forming a micro/nano rugged layer on the first semiconductor layer; and
forming an anti-reflection layer on the micro/nano rugged layer after the micro/nano rugged layer is formed, wherein a refractive index of the anti-reflection layer ranges between a refractive index of the micro/nano rugged layer and a refractive index of air.

19. The method according to claim 18, wherein a refractive index of the micro/nano rugged layer ranges between a refractive index of the epitaxial multilayer and a refractive index of air.

20. The method according to claim 18, wherein the micro/nano rugged layer is formed by stacking, sintering, anodic aluminum oxidizing (AAO), nano-imprinting, hot pressing, etching or electron beam writer (E-beam writer) processing.

21. The method according to claim 18, further comprising steps of:
forming a current spreading layer on the second semiconductor layer; and
forming a reflective layer on the current spreading layer.

22. The method according to claim 21, further comprising a step of:
combining a thermoconductive substrate with the reflective layer through a thermoconductive adhesive layer.

23. The method according to claim 22, further comprising steps of removing the epitaxial substrate;
disposing a first electrode on a portion of the first semiconductor layer; and
disposing a second electrode on a surface of the thermoconductive substrate;
wherein the micro/nano rugged layer is disposed on another portion of the first semiconductor layer.

24. The method according to claim 21, further comprising steps of:
forming a thermoconductive insulating layer on the reflective layer; and
combining a thermoconductive substrate with the thermoconductive insulating layer through a thermoconductive adhesive layer.

25. The method according to claim 24, further comprising steps of:
removing the epitaxial substrate;
removing a portion of the epitaxial multilayer to expose a portion of the current spreading layer;
disposing a first electrode on a portion of the first semiconductor layer; and
disposing a second electrode on the exposed portion of the current spreading layer.

26. The method according to claim 18, wherein the micro/nano rugged layer comprises a nano-ball, a nano-column, a nano-hole, a nano-point, a nano-line or a nano-concave-convex structure.

27. The method according to claim 18, wherein a material of the micro/nano rugged layer comprises $Al_2O_3$, $Si_3N_4$, $SnO_2$, $SiO_2$, resin, polycarbonate, ITO, AZO, ZnO or combinations thereof.

* * * * *